United States Patent [19]
Rudman et al.

[11] Patent Number: 5,392,288
[45] Date of Patent: Feb. 21, 1995

[54] ADDRESSING TECHNIQUE FOR A FAULT TOLERANT BLOCK-STRUCTURED STORAGE DEVICE

[75] Inventors: Richard A. Rudman, Princeton; Donald W. Smelser, Bolton; Paul W. Kemp, Northborough, all of Mass.

[73] Assignee: Quantum Corporation, Milpitas, Calif.

[21] Appl. No.: 652,870

[22] Filed: Feb. 8, 1991

[51] Int. Cl.$^6$ ............... H03M 13/00; G06F 11/00
[52] U.S. Cl. ............................. 371/2.2; 371/40.1
[58] Field of Search ............ 371/2.2, 40.1, 10.1, 371/40.2, 40.4

[56] References Cited

U.S. PATENT DOCUMENTS

| | | | |
|---|---|---|---|
| 3,222,653 | 12/1965 | Rice | 371/10.1 |
| 3,312,336 | 5/1974 | Bossen et al. | 371/38.1 |
| 3,654,610 | 4/1972 | Sander et al. | 371/2.2 |
| 3,781,826 | 12/1973 | Beausoleil | 371/2.2 |
| 4,006,467 | 2/1977 | Bowman | 371/2.2 |
| 4,074,236 | 2/1978 | Ishida . | |
| 4,321,692 | 3/1982 | Quadri . | |
| 4,335,459 | 6/1982 | Miller . | |
| 4,461,001 | 7/1984 | Bossen et al. . | |
| 4,470,142 | 10/1984 | Ive | 371/2.2 |
| 4,488,298 | 12/1984 | Bond et al. | 371/11.1 |
| 4,562,576 | 12/1985 | Ratcliffe | 371/11.4 |
| 4,630,230 | 12/1986 | Sundet . | |
| 4,692,923 | 10/1987 | Poeppelman | 371/2.2 |
| 4,742,517 | 5/1988 | Takagi et al. | 371/2.2 |
| 4,758,989 | 7/1988 | Davis et al. | 371/40.4 |
| 4,802,170 | 1/1989 | Trottier | 371/2.2 |
| 5,077,737 | 12/1991 | Lerger et al. | 371/10.1 |
| 5,164,944 | 11/1992 | Benton et al. | 371/40.1 |

Primary Examiner—Robert W. Beausoliel, Jr.
Assistant Examiner—Albert Decady
Attorney, Agent, or Firm—David B. Harrison

[57] ABSTRACT

A fault tolerant addressing arrangement for a solid-state disk comprising partially defective memory devices is provided. The addressing technique increments both row and column addresses when establishing locations for the storage of symbols so that the same rows and columns are not addressed for any two symbols. The technique also complements certain portions of the symbols' address to ensure addressing of different locations within each memory device.

12 Claims, 8 Drawing Sheets

FIG. 4

ADDRESS INVERSION TABLE

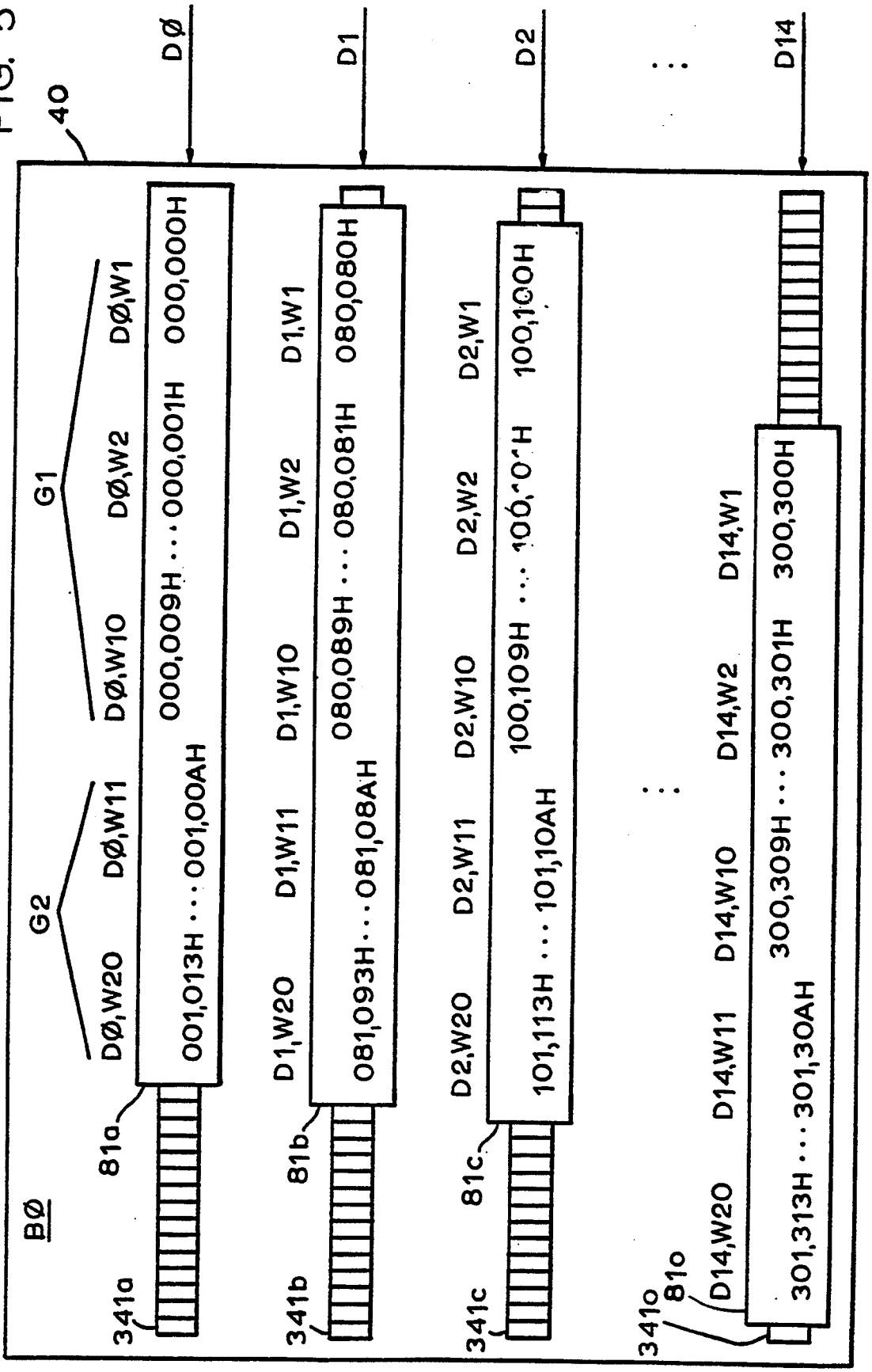

ADDRESSING TECHNIQUE FOR A FAULT TOLERANT BLOCK-STRUCTURED STORAGE DEVICE

FIELD OF THE INVENTION

This invention relates generally to a memory addressing method for digital computers and, more specifically to a fault tolerant addressing method which provides increased reliability in a solid-state disk consisting of memory devices known to contain defects.

BACKGROUND OF THE INVENTION

Dynamic random access memory (DRAM) devices constitute the main memories of most modern computers because their performance characteristics, e.g. the ability to quickly store and access information, are crucial to the efficient operation of the computer. A DRAM device is organized as one or more rectangular matrices, each of which is addressed in terms of rows and columns of storage elements. Specifically, each matrix consists of an array of storage elements, each holding one (1) bit of data that can be loaded into, or retrieved from, each storage element as required. The access time is generally the same for any bit in the DRAM regardless of its location.

Magnetic disks have traditionally dominated as secondary mass storage devices. Data is stored on magnetic disks in groups of blocks or sectors, which are the smallest units accessed in read or write operations. Access time to the data depends upon the location of a sector on the disk and is at least an order of magnitude longer than that of a DRAM. However, DRAM storage is more expensive than magnetic storage.

An alternative to magnetic disks for secondary storage is solid-state disks. A solid-state disk composed of an array of DRAMs provides high transfer rates, i.e. block transfers to and from memory, and fast access times. The block-access nature of the solid-state disk allows .error correction to be spread over more than one word, which translates into greater error recovery. Greater error recovery, provided by powerful error correction codes (ECC) such as Reed-Solomon codes, allows the "disk" to be constructed from less reliable, and thus less expensive, DRAMs without sacrificing product availability.

Reed-Solomon codes provide effective correction for the types of errors experienced on secondary storage media. Prior to storing data on a disk, a block of data is converted into error correction code symbols consisting of data and check symbols. More specifically, the check symbols are appended to the data symbols and the resulting "code block" is stored. When the code block is retrieved, the check symbols are used in the detection and correction of errors in the data symbols. The Reed-Solomon codes correct the errors on a symbol basis.

Less reliable DRAMs may be purchased at considerable price advantage because they have internal defects that are poorly defined; that is, certain groups of DRAMs, having failed the manufacturer's tests, are characterized as "partially bad" devices. The defects in those devices may be random or they may be correlated, i.e. in the same locations in the respective devices in an entire batch. The defects are manifested by the recording of erroneous data values in the storage elements. Unfortunately, when they are correlated, the number of erroneous symbols in a block of data exceeds the correction capability of a reasonable number of check symbols.

One approach to organizing data in a memory to optimize the memory's tolerance for system faults is described in patent application Ser. No. 376,357, filed Jul. 6, 1989, titled FAULT TOLERANT MEMORY, by Francis Reiff and assigned to the assignee of this invention. As described therein, 10-bit symbols in each block of data are organized vertically in RAM devices so that the same bit positions of ten different bytes of a given RAM device contain the ten bits of a symbol. With this technique, failure of one of the data lines connected to the memory affects only 32 symbols out of a total of 512 in a code block, and the resulting errors are thus correctable by the ECC. Moreover, each block is distributed among 32 RAM devices and failure of two RAM devices causes errors in only 32 symbols, again correctable by the ECC. The disclosed method does not, however, address the problem of data errors resulting from a correlated defect, such as an entire row defect, in each of an array of memory devices. In that case, there would be an error in a very large number of symbols in a code block, resulting in an uncorrectable set of errors.

SUMMARY OF THE INVENTION

Briefly, the arrangement in accordance with the present invention provides a fault tolerant addressing technique that increases the reliability of a solid-state disk array comprising memory devices known to contain defects. The addressing technique distributes symbols of a code block among the partially defective memory devices to protect against the failure of entire individual devices. In addition, it distributes individual symbols throughout different internal sections of the devices to avoid problems associated with correlated defects among the memory devices.

In particular, the addressing arrangement increments row and column addresses while establishing storage locations for the symbols in DRAMs so that similar row and column locations are not addressed for any two symbols. The arrangement also complements certain portions of the symbols' address to ensure addressing of different matrices among the DRAMs.

An advantage of this arrangement is that data errors resulting from correlated defects among the memory devices of the array appear random and can be corrected by error correction circuitry. Additionally, the addressing arrangement ensures that only one or two symbols of a code block are stored in each device, thereby lowering the probability that a common error across an array of memory devices will result in a nonrecoverable error situation and permanent loss of stored data.

BRIEF DESCRIPTION OF THE DRAWINGS

The above and further advantages of the invention may be better understood by referring to the following description in conjunction with the accompanying drawings in which:

FIG. 4 is an address inversion table indicating the state of each address bit applied to each data bit path in the storage array;

DETAILED DESCRIPTION OF ILLUSTRATIVE EMBODIMENTS

Figure 1:
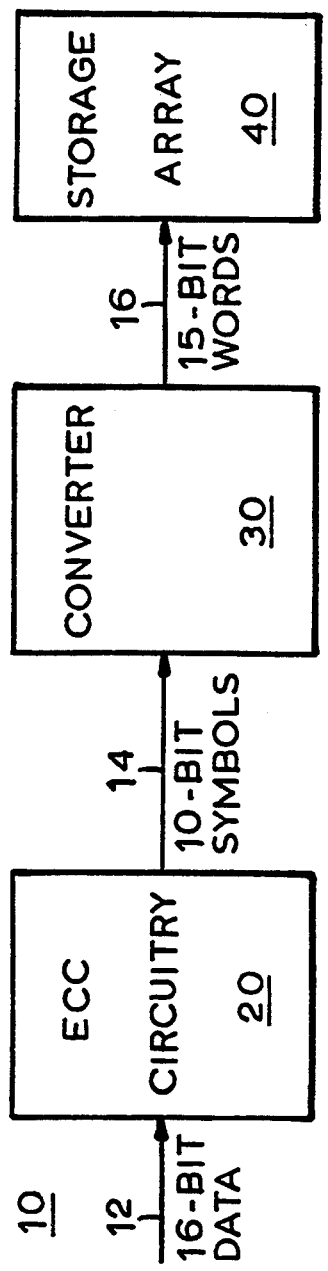
FIG. 1 is a block diagram of a solid-state disk system including an array suitable for storing symbols in accordance with the present invention.

Referring to FIG. 1, a solid-state disk system 10 consists of a storage array 40 and error correction code (ECC) circuitry 20 coupled by a converter 30. The storage array 40 comprises, for example, four hundred and eighty (480) 4 Mb×1 "partially bad" DRAMs that provide approximately 214 MB of data storage. Each partially bad DRAM preferably has a maximum of 0.2% internal storage element failures or as many as eight thousand (8000) defective bits, with common failure modes being single-bit errors, bit-line errors, word-line defects and matrix defects.

ECC circuitry 20 provides error detection and correction of data retrieved from the solid-state disk 10 and, as such, preferably includes the encoding, decoding and error correction functions of Reed-Solomon codes. Prior to storing a block of data in array 40, the ECC circuitry 20 encodes the data to Reed-Solomon code blocks of symbols. More specifically, the ECC circuitry 20 receives 512 bytes of data via a two-byte (16-bit) data bus 12 and generates a string of 10-bit error correction symbols including check symbols that are appended to data symbols to form a code block 22.

Figure 2:
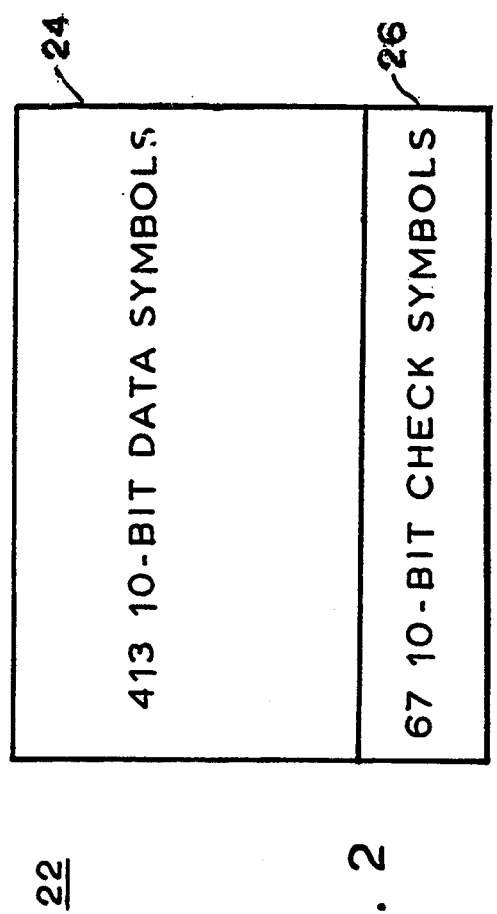
FIG. 2 is a diagram depicting the contents of a code block used in accordance with the invention.

FIG. 2 is a diagram of a code block 22. A code block 22 is the basic unit of organization within the solid-state disk 10; that is, the code block 22 is stored, retrieved and corrected as a unit. An entire code block 22 has four hundred and eighty (480) 10-bit symbols (4800 total bits) comprising approximately four hundred and thirteen (413) data symbols 24 and sixty-seven (67) check symbols 26.

The Reed-Solomon code can correct 32 of the 480 code block symbols and detect 35 symbols with errors. In contrast, conventional Hamming codes used with main memory RAMs typically correct single-bit errors and detect double-bit errors. The solid-state disk 10 utilizes such powerful error correction capability because the memory devices constituting the disk are known to have defects. In many instances, the defects are correlated among an array of devices.

In accordance with the present invention and with reference again to FIG. 1, the addressing apparatus includes means for apportioning a code block 22 among groups of 10-bit symbols and means for converting the groups of 10-bit symbols to sets of words. As embodied herein, such means may include a converter 30 that receives the 10-bit symbols of code block 22 from the ECC circuitry 20 via a 10-bit bus 14 and organizes the symbols into groups of fifteen (15). The converter 30 then arranges the symbols into sets of ten (10) 15-bit words. The organization and arrangement function is preferably implemented with a buffer having a 15-bit output, although it will be apparent to those skilled in the art that other techniques could be used without deviating from the inventive concepts described herein. Each word is thereafter transferred to the storage array 40 via a 15-bit bus 16. The 15-bit words are then stored in the array 40 in accordance with the addressing arrangement described herein.

The addressing arrangement provides increased reliability and a fault tolerant structure for the solid-state disk 10. In particular, it concentrates individual symbols of a code block 22 within different sections of individual DRAMs and distributes the symbols of the code block 22 among many DRAMs in the array 40. Distribution is performed in a predictable manner that results in a random effect so that it is not necessary to know the locations or type of defects in the DRAMs; in summary, the addressing technique enables the solid-state disk 10 to function with a high probability of success.

More specifically, the addressing arrangement provides a means for storing individual symbols in individual DRAMs. To this end, an entire symbol is always stored in a single DRAM to cluster potential errors; that is, the contents of a symbol are not distributed among multiple DRAMs. This technique minimizes the impact of word-line failures internal to the DRAM. For example, a row address defect results in only one symbol failure because all the row bits are concentrated in that symbol.

Figure 3A:
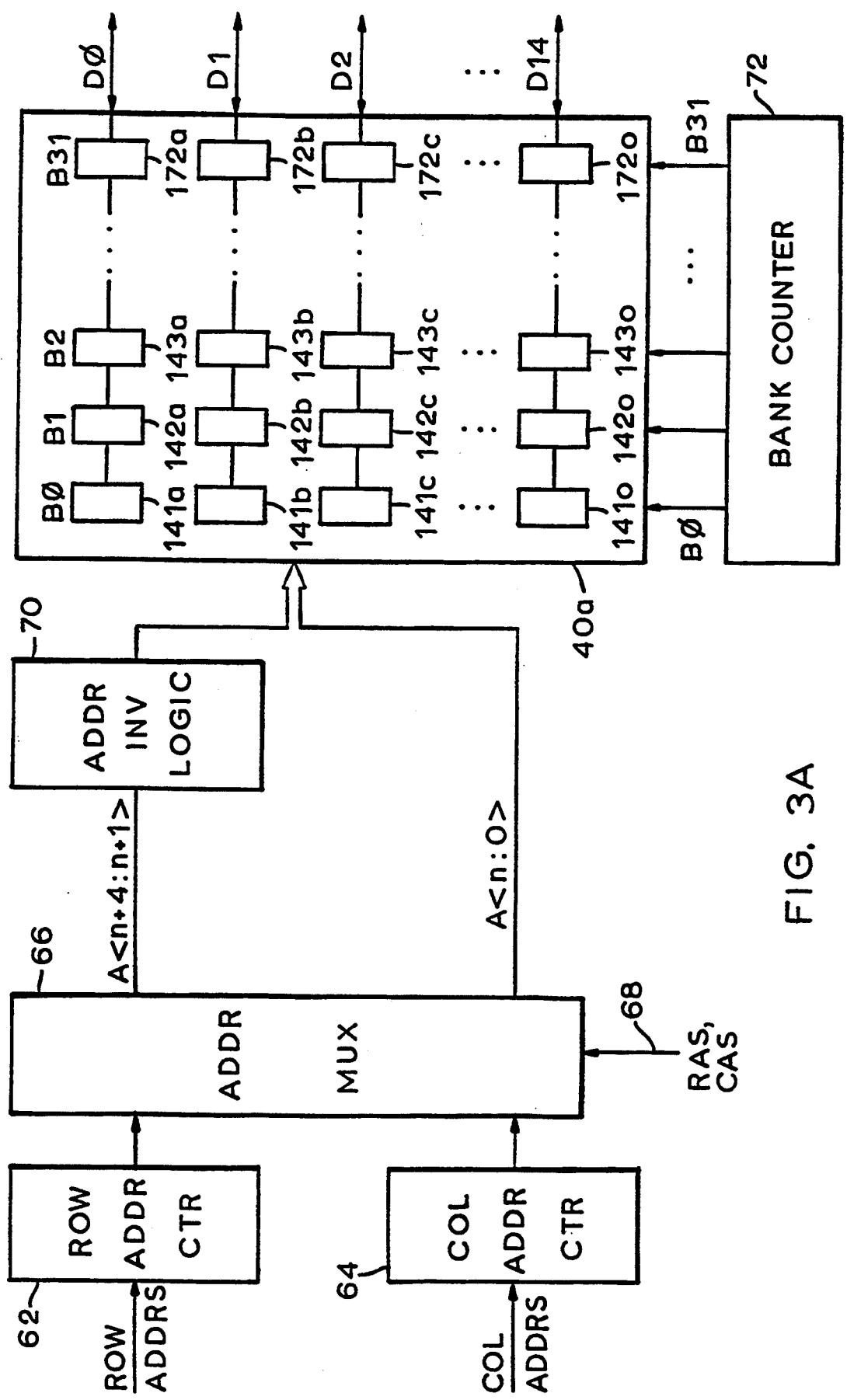
FIG. 3A is block diagram illustrating one embodiment of the organization of DRAMs in the storage array in accordance with the invention.
Figure 3B:
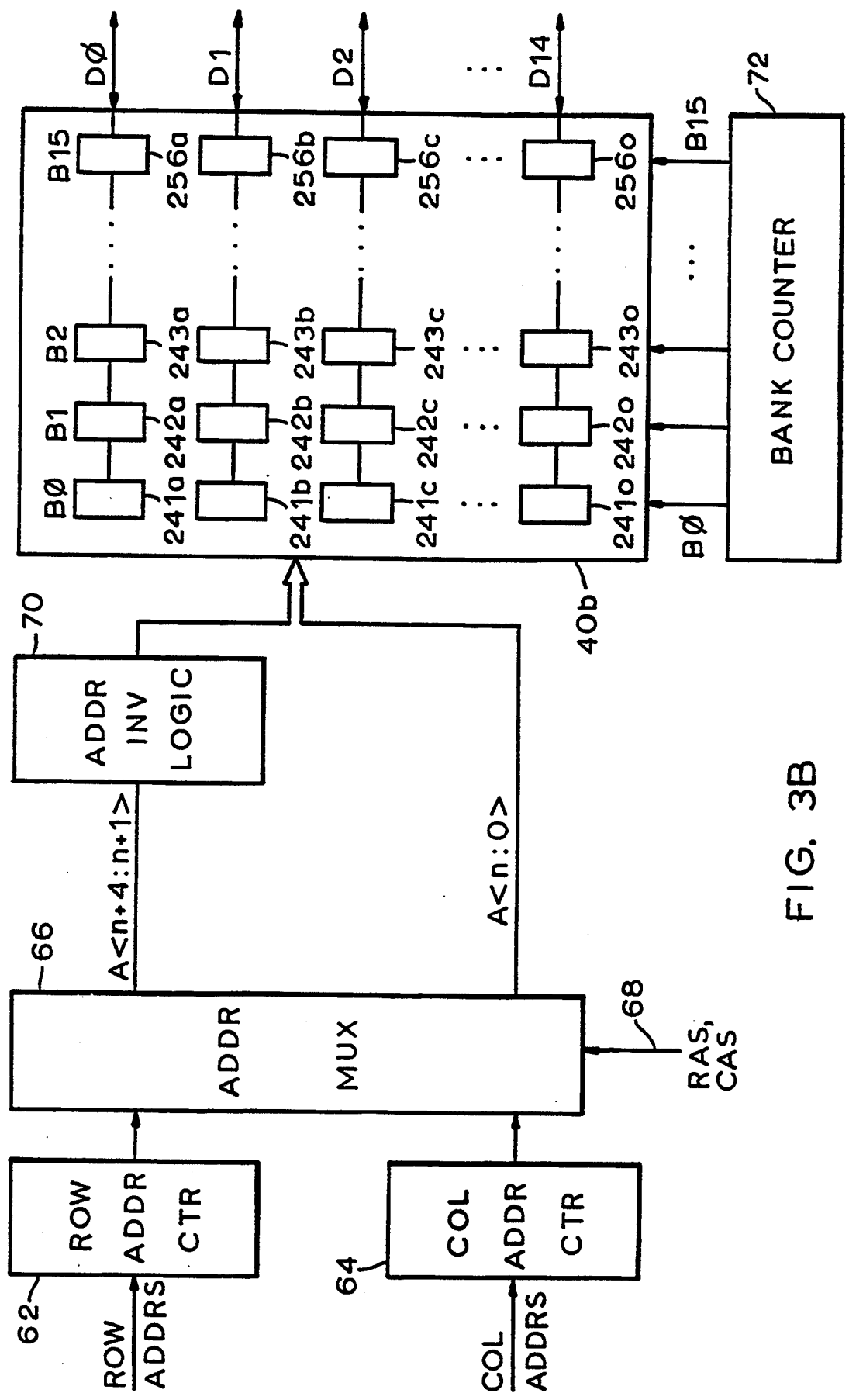
FIG. 3B is block diagram illustrating another embodiment of the organization of DRAMs in the storage array in accordance with the invention.

FIGS. 3A and 3B illustrate the organization of the DRAMs in storage arrays 40a and 40b, respectively. Each DRAM stores 4 megabits of data in 2048 rows and 2048 columns. In FIG. 3A, array 40a consists of fifteen DRAMs 141a–o by thirty-two DRAMs 141a–172a for a total of 480 DRAMs. More specifically, the array 40a is organized into thirty-two banks B0–31 of fifteen bits. In FIG. 3B, array 40b consists of fifteen DRAMs 241a–o by sixteen DRAMs 241a–256a for a total of 240 DRAMs. Here, the array 40b is organized into sixteen banks B0–15 of fifteen bits. Otherwise, the addressing apparatus of the FIGS. 3A and 3B embodiments are similar. Addressing for each of the fifteen DRAMs in a bank is performed on a per-bit basis. In contrast, conventional array addressing is performed on a per-bank basis. Thus, the addresses for symbols stored on arrays 40a and 40b, hereinafter generally designated array 40, are unique to a particular bit path.

Each 4 Mb DRAM is internally partitioned into a minimum of sixteen matrices. Selective inversion of high-order address bits ensures that each of the fifteen data bits of a word is accessed from a different matrix within the DRAMs. Such an addressing arrangement minimizes the effects of a common error among the DRAMs, while reducing the probability of an uncorrectable error condition and permanent loss of data.

In accordance with the present invention, the addressing apparatus includes means for storing each bit of a word in each memory device of a particular bank at a particular row address and column address. The addressing apparatus further includes means for successively incrementing the column address and storing subsequent to each incremented interval each bit of successive words in each memory device of the particular bank at the particular row address and an incremented column address. As embodied herein, such means may include row address counter 62, column address counter 64, address multiplexer 66, address inversion logic 70, bank counter 72 and storage array 40.

Row and column addresses are loaded into counters 62 and 64, respectively. The counters provide a means for incrementing the addresses during and after page mode cycle operations, as described below. The outputs of the counters 62, 64 are coupled to an address multiplexer 66, which is enabled by a row address strobe (RAS) or column address stobe (CAS) signal on line 68. The output of the multiplexer 66 is divided into two (2) fields: address field <n:0> and address field <n+4:n+1>. The field <n:0> is driven directly to storage array 40 and represents true address bits, while the field <n+4:n+1> is coupled to array 40 via address inversion logic 70. The address inversion logic 70 provides selective inversion of higher-order address bits as described below in connection with FIG. 4. Bank counter 72 is coupled to array 40 and selects the appropriate bank of DRAMs for the storage of data bits D0–D14.

Operationally, fifteen DRAMs within a bank are accessed simultaneously during a page mode cycle operation. A page mode cycle consists of a row address followed by an initial column address driven to a particular bank. Thereafter, the column address increments nine (9) times. For each page mode cycle, fifteen 10-bit symbols are accessed from the fifteen DRAMs of the bank at a particular row address and ten (10) successive column addresses. An entire 10-bit symbol is accessed from each DRAM.

For the next page mode cycle, the bank select in counter 72 increments by one (1), the row address in counter 62 increments by one (1) and the column address in counter 64 successively increments ten (10) times to access each DRAM of the bank. A different bank, row and range of columns are thus addressed. This addressing arrangement, which is preferably utilized in connection with the thirty-two bank organization embodiment of FIG. 3A, eventually propagates addresses throughout the entire array 40. One (1) symbol for each code block 22 is stored in every DRAM. The symbols are accessed from different row and column addresses in a manner that scatters the location of individual symbols throughout internal sections of each DRAM. Systematic faults in a column or row among the DRAMs will thus manifest in only one symbol in a code block 22. In contrast, if a bank of DRAMs receive the same addresses and defects exist at those addresses, fifteen symbol errors will occur, consuming almost half of the error correction capability.

In an alternate embodiment according to the invention, two page mode cycles complete prior to incrementing the bank count by one, i.e. B0–B1. This arrangement is preferably utilized with the sixteen bank organization depicted in FIG. 3B. As with the previous embodiment, each row of a DRAM contains one code block symbol and each column contains one bit of a symbol; however, exactly two symbols for each code block 22 are stored in every DRAM. Thus, if a DRAM were to fail completely, only two symbols in the code block would need correction. By allocating two symbols for every DRAM and distributing the symbols of a code block 22 throughout the array 40, many DRAMs could fail and be corrected by the error correction circuitry. The Reed-Solomon code can correct thirty-two (32) symbols in every code block or sixteen (16) DRAMs out of the two hundred and forty (240) DRAM array.

The present invention also addresses the problem of systematic defects among DRAMs. An example of a systematic or correlated defect is a flaw in the mask set used to fabricate a batch of DRAMs. The flaw could relate to a row or column location causing errors in a large number of DRAMs. The addressing arrangement ensures individual symbols are stored in different matrices of individual DRAMs.

In accordance with the present invention, the addressing apparatus includes means for selectively inverting a predetermined number of most significant address bits corresponding to internally partitioned sections of the memory devices. As embodied herein, such means may include address inversion logic 70. More specifically, address inversion logic 70 provides a selective inversion technique to establish storage locations for symbols within the DRAMs. The technique scatters symbol addresses among different matrices of the DRAMS that are accessed concurrently.

Array addressing involves bank select bits in addition to row address and column address bits. More specifically, eleven row address bits and eleven column address bits are utilized for a total of twenty-two bits. This provides access to four megabits of storage in each DRAM. The address inversion logic 70 complements the higher-order address bits to different combinations for each of the fifteen symbol positions accessed. The address inversion table of FIG. 4 identifies the state of each address bit applied to each data bit in the storage array 40. It will understood to those skilled in the art that the table of FIG. 4 can be used to implement logic required for the selective inversion of the high-order address bits.

Figure 4:
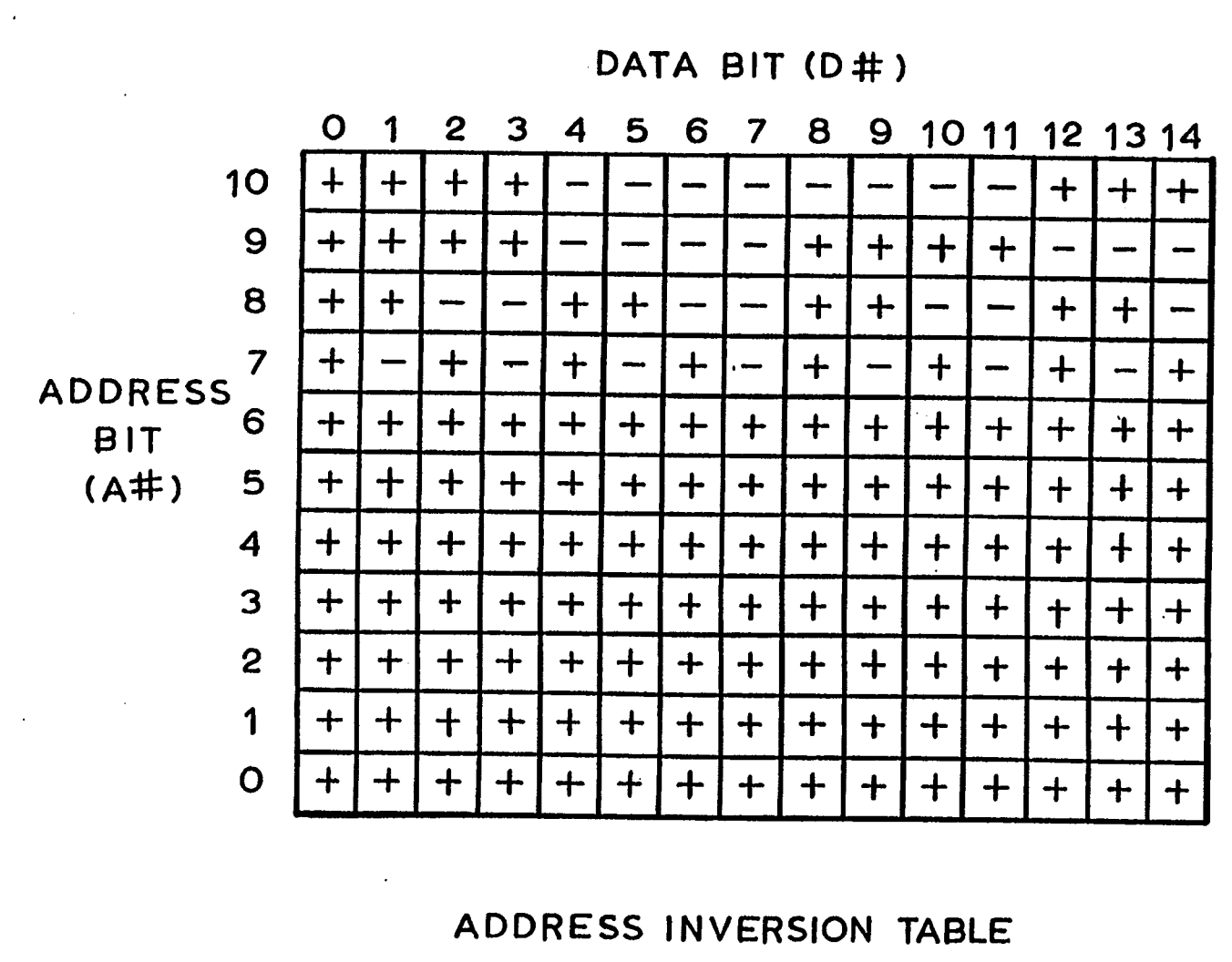

In FIG. 4, the x-axis of the inversion table represents a data bit from each of the fifteen DRAMs of a bank. The y-axis represents the address bits driven to array 40 of which bits 0–6 are true address bits. Sixteen binary combinations are needed to address fifteen DRAMs, so four high-order address bits <10:7> are used to derive different address locations for each DRAM in the bank. The most significant address bits are preferably used because addresses are incremented on the least significant bits. These high-order address bits also correspond to a matrix-select field of a DRAM address. By inverting the high-order bits, locations are guaranteed to vary among the DRAMs.

Figure 5:
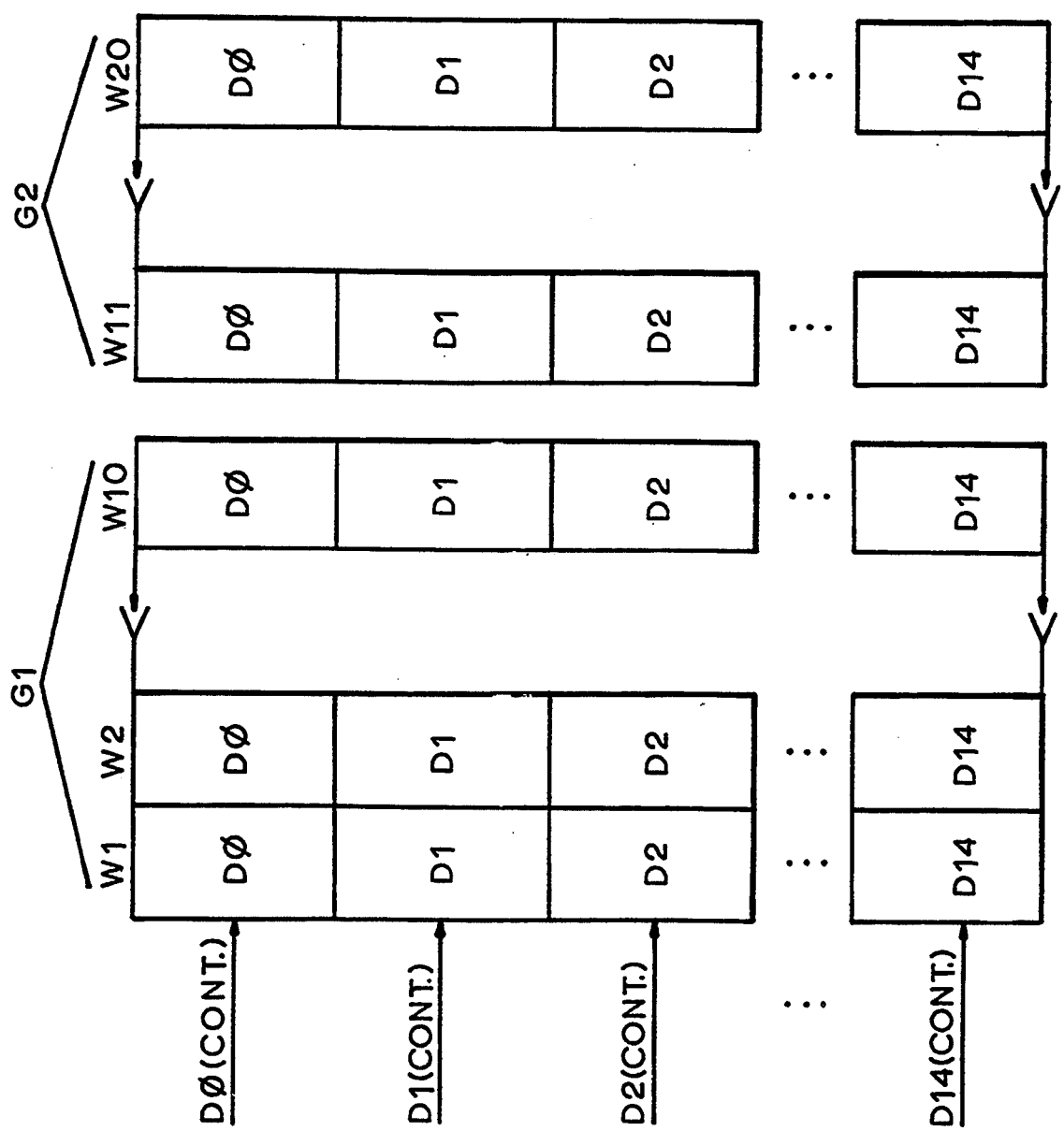
FIG. 5 is a block diagram illustrating the organization of symbols stored on the DRAM storage array of the solid-state disk.

FIG. 5 depicts the organization of symbols stored in a bank of DRAMs, generally designated 341a–o, on a storage array, generally designated 40. An example of the inversion technique is described for each bit of groups of ten 15-bit words transferred from converter 30 (FIG. 1) for storage on array 40 during a page mode write cycle. Each DRAM 341a–o is internally partitioned into sixteen matrices, as highly schematicized in the drawing. Unite combinations of address bits <10:7> are initially driven to each DRAM 341a–o of Bank 0 to store a first 15-bit word W1 of group G1. In the following example, the row and column address locations are given in hexadecimal notation with the row address preceding the column address. Bit D0 of word W1 is stored in matrix 81a of DRAM 341a at address <000,000H>; bit D1 is stored in matrix 81b of DRAM 341b at address <080,080H>; bit D2 is stored in matrix 81c of DRAM 341c at address <100,100H>; and so forth until bit D14 is stored in matrix 81o of DRAM 341o at address <300,300H>.

The column address then increments by one prior to storing a second 15-bit word W2. Bit D0 of word W2 is then stored in matrix 81a of DRAM 341a at address <000,001H>; bit D1 is stored in matrix 81b of DRAM 341b at address <080,081H>; bit D2 is stored in matrix 81c of DRAM 341c at address <100,101H>; and so forth until bit D14 is stored in matrix 81o of DRAM 341o at address <300,301H>. The column address thereafter successively increments eight (8) times, as each bit of successive words of group G1 is stored in the bank of DRAMs subsequent to each incremented interval. At this point, a tenth 15-bit word W10 is stored in the DRAMs 341a-o. That is to say, bit D0 of word W10 is stored in matrix 81a of DRAM 341a at address <000,009H>; bit D1 is stored in matrix 81b of DRAM 341b at address <080,089H>; bit D2 is stored in matrix 81c of DRAM 341c at address <100,109H>; and so forth until bit D14 is stored in matrix 81o of DRAM 341o at address <300,309H>.

The page mode write cycle now completes and fifteen, 10-bit symbols are stored in Bank 0. More specifically, one (1) entire symbol is stored in a different matrix of each DRAM. For example, bits D0 of words W1-10 are stored in matrix 81a of DRAM 341a at address <000,000-009H> and bits D2 of words W1-W10 are stored in matrix 81c of DRAM 341c. For the array embodiment of FIG. 3A, the bank select, row address and column address thereafter increment by one to address a different bank of DRAMs having a different row and range of columns for the storage of a second group G2 of ten 15-bit words W11-W20 on array 40.

However, for the embodiment of FIG. 3B, only the row and column addresses increment by one (1) and the first 15-bit word W11 of the second group G2 is stored in the DRAMs 341a-o of Bank 0. Thus, bit D0 is stored in matrix 81a of DRAM 341a at address <001,00AH>; bit D1 is stored in matrix 81b of DRAM 341b at address <081,08AH>; bit D2 is stored in matrix 81c of DRAM 341c at address <101,10AH>; and so forth until bit D14 is stored in matrix 81o of DRAM 341o at address <301,30AH>. The column address thereafter successively increments nine (9) times and each bit of nine (9) successive words W12-20 is stored in Bank 0. At this point, bit D0 of word W20 is stored in matrix 81a of DRAM 341a at address <001,013H>; bit D1 is stored in matrix 81b of DRAM 341b at address <081,093H>; bit D2 is stored in matrix 81c of DRAM 341c at address <101,113H>; and so forth until bit D14 is stored in matrix 81o of DRAM 341o at address <301,313H>. As a result, and in accordance with this alternate embodiment, two (2) entire symbols are now stored in a different matrix of each DRAM 341a-o of Bank 0.

The addressing arrangement of the present invention accesses either one or two symbols from a different matrix of each DRAM so that correlated errors will manifest in different code blocks. The prior art disclosed scattering symbols throughout a memory array to withstand the failure of entire RAMs. The present invention solves the additional problem of errors correlated among DRAMs, because it is known that the DRAMs used in storage array 40 have defects. A characteristic of known, defective DRAMs is that a batch of DRAMs may all be defective in the same way.

Figure 6:
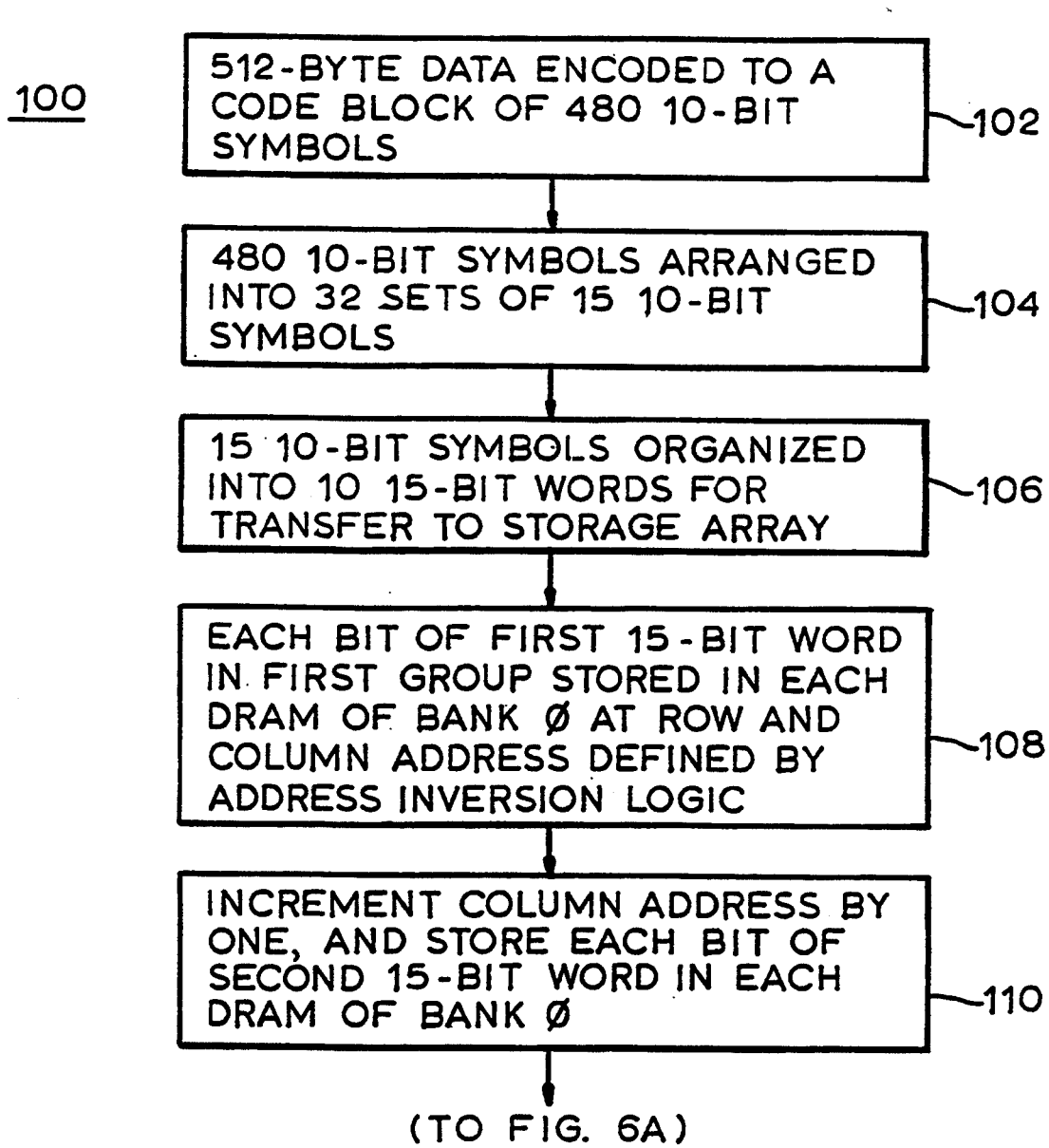
FIGS. 6 and 6A are flow-charts describing the fault tolerant addressing arrangement in accordance with the invention.
Figure 6A:
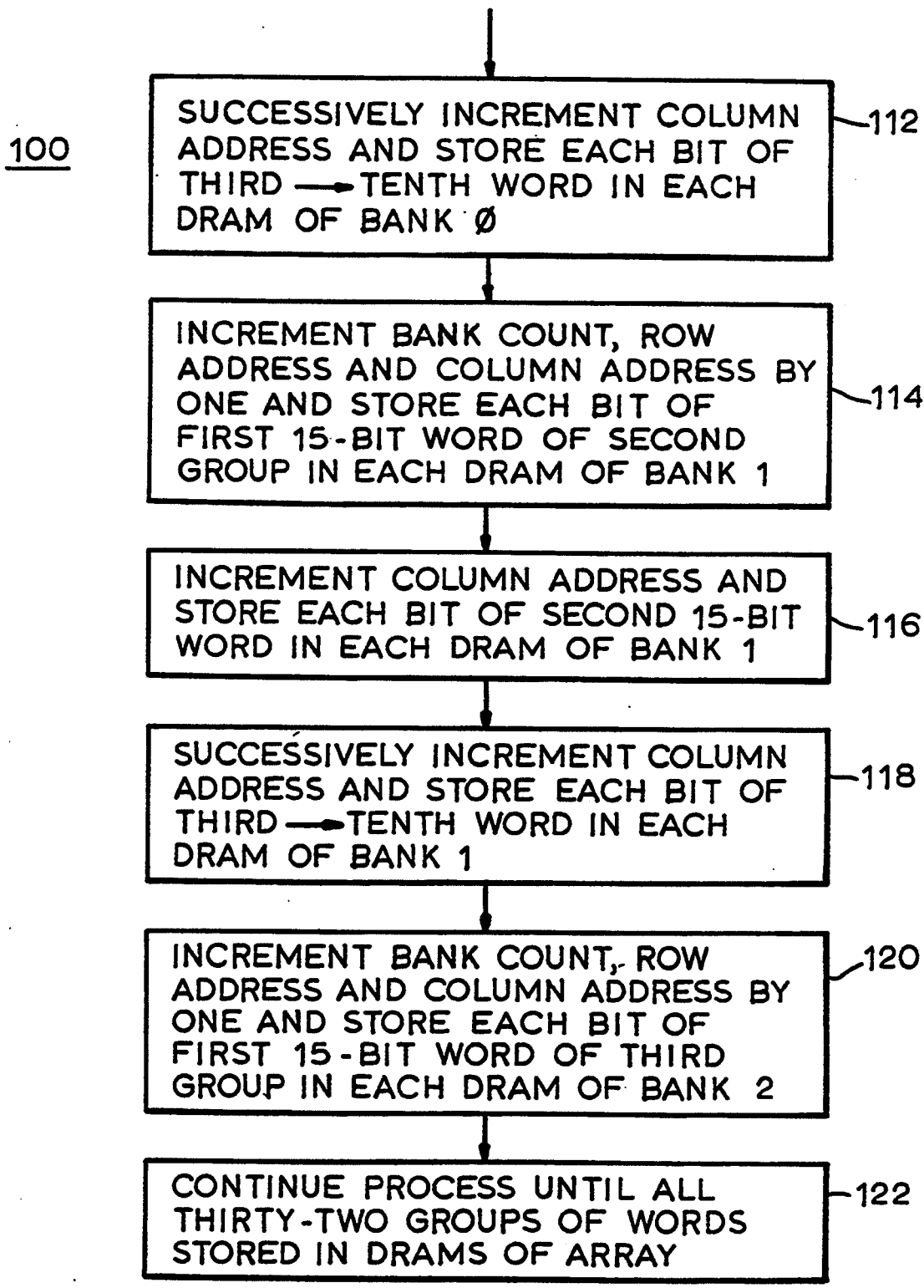

The entire fault tolerant addressing arrangement may be understood from the flow chart 100 of FIG. 6. In step 102, a 512-byte sector of data is encoded by the Reed-Solomon code circuitry into a code block of four hundred and eighty (480) 10-bit error correction code symbols. In step 104, the converter arranges the 480 10-bit symbols into thirty-two (32) sets of fifteen (15), 10-bit symbols. In step 106, the converter then organizes each of the 32 sets of fifteen, 10-bit symbols into thirty-two (32) sets of ten (10), 15-bit words, which are transferred to the array 40 for storage.

Starting at particular address location defined by the address inversion table of FIG. 4, each bit of a first 15-bit word in a first group is stored in each of the fifteen DRAMs in Bank 0 (step 108). In step 110, the column address increments by one and each bit of a second 15-bit word is stored in each DRAM of the bank. The column address successively increments and the process repeats in step 112 until each bit of a tenth 15-bit word is stored in each DRAM.

In step 114, the bank count and the row/column addresses increment by one, and each bit of a first 15-bit word of a second group is stored in each of the fifteen DRAMs in bank 1. The column address increments by one and each bit of a second 15-bit word is stored in each DRAM (step 116). Once again, in step 118, the column address successively increments and the process repeats until each bit of a tenth 15-bit word is stored in each DRAM.

In step 120, the bank count and the row/column addresses again increment by one, and each bit of a first 15-bit word of a third group is stored in each of the fifteen DRAMs of bank 2. This method continues in step 122 until each 15-bit word in all thirty-two groups of words are stored in the array 40.

While there has been shown and described preferred embodiments, it is to be understood that various other adaptations and modifications may be made within the spirit and scope of the invention, with the attainment of some or all of its advantages. For example, the invention is equally applicable to an addressing method that adds an offset to a base address. Within a bank, a constant offset would be added to the base row address and different offsets would be used depending upon the bank accessed. Similarly, it is to be understood that five high-order address bits would be used for the selective inversion operation if the organization of the array consisted of thirty-two DRAMs per bank.

It will therefore be apparent to those skilled in the art that various changes and modifications in the specifically described embodiments can be carried out without departing from the scope of the invention which is to be limited only by the scope of the appended claims.

What is claimed is:

1. A method for storing error correction code symbols in a storage array having a plurality of banks of partially defective memory devices coupled to an error correction code unit, said symbols corresponding to a block of information encoded by said error correction code unit to a code block, said method comprising the steps of:

apportioning said error correction code symbols into a plurality of defined groups of symbols;

converting a first of said defined groups of symbols to a plurality of sets of multiple-bit words;

storing each bit of a first word within a first set of words in each memory device of a first bank at a location defined by a bank count, a row address and a column address; and successively incrementing said column address and storing subsequent to each incremented interval each bit of successive words within said first set in each memory device of said first bank at a location defined by said row address and said successively incremented column address until all of said words within said first set are stored in said array.

2. The method of claim 1 further comprising the step of selectively inverting a predetermined number of most significant bits of said row and column addresses, said predetermined number of bits corresponding to internally partitioned sections of said memory devices.

3. The method of claim 2 wherein the steps of storing further comprises storing each bit of said multiple-bit words in said sections of said memory devices in accordance with said selectively inverted bits such that each bit of said word is stored in a different section of said memory devices.

4. The method of claim 3 further comprising the step of incrementing said bank count, said row address and said column address, and storing each bit of a first word within a second set of words in each memory device of a second bank.

5. The method of claim 4 further comprising the step of successively incrementing said column address and storing subsequent to each incremented interval each bit of successive words within said second set in each memory device of said second bank at a location defined by said incremented bank count and row address, and said successively incremented column address, until all of said words within said second set are stored in said array.

6. The method of claim 5 further comprising the step of incrementing said bank count, said row address and said column address, and storing each bit of a first word within a third set of words in each memory device of a third bank.

7. The method of claim 6 further comprising the step of successively incrementing said column address and storing subsequent to each incremented interval each bit of successive words within said third set in each memory device of said third bank at a location defined by said incremented bank count and row address, and said successively incremented column address, until all of said words within said third set are stored in said array.

8. Apparatus for storing error correction code symbols in a storage array having a plurality of banks of partially defective memory devices coupled to an error correction code unit, said symbols corresponding to a block of information encoded by said error correction code unit to a code block, said apparatus comprising:

means for apportioning said error correction code symbols into a plurality of defined groups of symbols;

means, coupled to said apportioning means, for converting a first of said defined groups of symbols to a plurality of sets of multiple-bit words;

means, coupled to said converting means, for storing each bit of a first word within a first set of words in each memory device of a first bank at a location defined by a bank count, a row address and a column address; and means, coupled to said storing means, for successively incrementing said column address and means for storing subsequent to each incremented interval each bit of successive words within said first set in each memory device of said first bank at a location defined by said row address and said successively incremented column address until all of said words within said first set are stored in said array.

9. The apparatus of claim 8 further comprising means, coupled to said successively incrementing means, for selectively inverting a predetermined number of most significant bits of said row and column addresses, said predetermined number of bits corresponding to internally partitioned sections of said memory devices.

10. The apparatus of claim 9 wherein said means for storing further comprises means for storing each bit of said multiple-bit words in said sections of said memory devices in accordance with said selectively inverted bits such that each bit of said word is stored in a different section of said memory devices.

11. The apparatus of claim 10 wherein said successively incrementing means further comprises means for incrementing said bank count, said row address and said column address, and means for storing each bit of a first word within a second set of words in each memory device of a second bank.

12. The apparatus of claim 11 wherein said successively incrementing means further comprises means for successively incrementing said column address and means for storing subsequent to each incremented interval each bit of successive words within said second set in each memory device of said first bank at a location defined by said incremented bank count and row address, and said successively incremented column address, until all of said words within said second set are stored in said array.

* * * * *